WITNESSES:
John G. Chopp
James F. Young

INVENTORS
Irving F. Barditch, John W. Dzimianski
and Edgar L. Fogle
BY
John L. Viegrafe
ATTORNEY United States Patent Office 3,361,984

Patented Jan. 2, 1968

3,361,984

SIGNAL TRANSLATION SYSTEM UTILIZING TRANSPORT DELAY FEEDBACK

Irving F. Barditch, Baltimore, John W. Dzimianski, Catonsville, and Edgar L. Fogle, Severna Park, Md., assignors to Westinghouse Electric Corporation, Pittsburgh, Pa., a corporation of Pennsylvania Filed May 12, 1965, Ser. No. 455,241

5 Claims. (Cl. 330—31)

This application is a continuation-in-part application of copending application, Ser. No. 80,877, filed Jan. 5, 1961, in the names of Irving F. Barditch and Edgar L. Fogle and assigned to the assignee of this application, now abandoned.

This invention relates to signal translation systems and particularly to frequency selective circuits which can be utilized as amplifiers and oscillators.

Tuned amplifiers for use at high radio frequencies of the order of 10 megacycles and above have usually necessitated the use of tuning inductances; and as is well known in the art, inductance is not readily obtainable in a semiconductor structure. The use of lumped resistance-capacitance phase shift networks is usually not very feasible at these and higher radio frequencies due to the impedance levels involved in building the network; the values of stray and parasitic resistance and capacitance are such that the orders of magnitudes of stray resistance and capacitance become equal to those which are used to determine the circuit performance, with resulting disadvantages.

In accordance with the present invention, frequency selectively or tuning is accomplished by utilizing the transport time interval required for signals to be propagated through selected means, other than open space, to effect virtual electrical phase shift. Thus, a signal introduced at one point in the system will have a determinable finite transit velocity associated with a finite transit interval. When the transit time intervals and the transition characteristics of the system are correlated by a feedback mechanism, regenerative effects for selected bands of frequencies can be produced to thereby provide frequency selective circuits.

This principle can be applied to a variety of arrangements, including semiconductor devices so that frequency selective circuits without inductances can be provided thus permitting complete miniaturization of frequency selective circuits in monolithic semiconductor blocks.

In one version of the present invention, semiconductor transistor devices are combined with a delay device utilizing electromagnetic and electrostatic fields such as exist in coaxial cables or waveguides, to obtain transport delay in propagation and in other versions of the invention, the finite transit time of electric current by means of majority and minority carriers in semiconductor materials is utilized to enable complete molecularization and miniaturization of signal translation systems in accordance with the present invention.

The apparatus of the instant invention overcomes disadvantages of the prior art and provides a semiconductor structure in which the necessity for inductance in a tuned circuit is eliminated. The first embodiment includes a semiconductor block having a grounded emitter transistor portion which feeds an emitter follower transistor portion which in turn feeds a section of coaxial cable of a selected length to give a suitable delay in the signal of preselected frequency at the output, a portion of the output signal being applied by conducting means or a conducting path as a feedback signal to the grounded emitter transistor portion. Another embodiment uses a delay cable as a series collector load for the grounded emitter structure. In each case, a suitable delay allows positive feedback at the input to give gain at the chosen frequency. If desired, a resistor may be included in the grounding leg of the delay cable to provide one but not the only type of bridged-T filter, if it is desired to operate the amplifier structure in a degenerative rather than a regenerative mode.

Another version of the invention utilizes a semiconductor signal transport delay line to accomplish a part of the virtual electrical phase shift.

Although the mechanism by which electric current is conducted by semiconductors is now generally considered to be well understood, it will perhaps be helpful here to review this phenomena to provide a quicker and more vivid understanding of the present invention.

It is known that conductivity in semiconductor materials such as germanium and silicon and other materials, involve transport or movement of majority and minority carriers, otherwise known as electrons and holes. The type of carriers normally in excess in the material due to the doping impurity determines the conductivity of the material.

For example, in N-type semiconductors, the carriers normally in excess are electrons whereas in P-type semiconductors the excess carriers are holes. An increase in the number of carriers at any region in a semiconductor material results in an increase in the conductivity of that region and conversely a decrease in the number of carriers at the region effects a decrease in the conductivity at that region. The flow of carriers through a semiconductor material is characterized by transit times of substantial magnitudes for practical purposes. The transit times, or velocity, is a function of the electric field applied to the semiconductor body along the direction of flow of the holes. The drift time factor of the holes in the material is inversely proportional to the voltage of the applied field. Minority carriers travel at a velocity substantially below the velocity of light while majority carriers travel at substantially the velocity of light.

From the general knowledge of transistors, it is well known that carriers of the sign opposite that of the carriers normally in excess in a semiconductor body can be injected into a body as by way of a forwardly biased rectifying junction on the body and be caused to drift or flow toward an appropriately biased second rectifying connection to the body. These connections are generally termed emitter and collector, respectively. It will be readily apparent that the holes injected into a body of semiconductor material by the rectifying junction will be effected by the drift field previously mentioned and that the velocity of the drift will be dependent upon the voltage applied. Accordingly, it follows that the flow of holes can be readily modulated by any varying voltage applied to the forward biased rectifying junction. Likewise, it follows that the conductivity of the material is also modulated.

Utilizing the semiconductor body in circuit elements such as modulators, amplifiers and oscillators wherein the semiconductor is provided with a base, emitter and a collector, modulation of the collector current may be effected by injecting minority carriers, that is, electric charges of a polarity not present in the semiconductor body through a rectifying contact. In the case where N-type material is used, holes are injected into the body by current flowing in the easy flow direction at the emitter. The holes moving through the body flow to the region of the collector where they aid the emission of electrons at that point and thus power multiplication is produced.

The drift velocity of electrons or holes when under the influence of an electric field in a semiconductor can be varied over a fairly wide range of values. For example, in germanium it will vary reach $5 \times 10^6$ centimeters/seconds and the lifetimes of minority carriers can be as high as a millisecond or more, a time interval that can correspond to a frequency between 100 kc. and 1000 kc. per second. Drift doping may be used to supply or supplement applied electric fields needed to produce a given drift velocity.

In accordance with one embodiment of the present invention utilizing semiconductor materials, both for the transport time delay and amplification, minority carriers are injected by a suitable rectifying contact, constituting an injector emitter, into one end of a semiconductor body under the influence of a forward biasing field, and are taken out through a second rectifying contact which also serves as the collector of an integral transistor amplifier which amplifies the signal. The distance between the injecting electrode and the collector of the transistor is so related to the magnitude of the drift field that the signal on the collector of the transistor is applied to the injecting electrode in proper phase to produce regenerative action for a selected band of frequencies. Since the transistor collector output impedance is very high relative to the injector emitter input impedance, it is preferable to provide suitable impedance and isolation means between the collector of the transistor amplifier and the injecting emitter electrode for the semiconductive body. As a result of this arrangement "on-frequency" signals will be reinforced while "off-frequencies" will be canceled. Suitable control of the amplifier gain can make the unit an oscillator or a bandpass filter, while control of the drift field will control the frequency of operation.

In another embodiment of the invention from the standpoint of fabrication, but equivalent from the electrical standpoint, the semiconductive transport delay line is not integral with the transistor amplifier stage, a rectifying collector junction separate from the transistor being provided on the end of the semiconductor body opposite the ejector emitter electrode. This latter collector electrode is connected to the base of a separate transistor amplifier by an ohmic connecton. In this latter embodiment, as well as in the one previously mentioned, the isolation and impedance matching means are in the form of an emitter follower output stage to which the ejector emitter electrode on the semiconductor body is connected. However, it is not absolutely essential that the emitter follower amplifier section be provided although best results are obtained by using an impedance matching and isolating stage.

Accordingly an object of the invention is to provide a novel and improved tunable oscillator and amplifier which may be made electrically tunable if desired.

A further object is to provide a new and improved signal translation system which utilizes transport delay characteristics of semiconductor material to provide the feedback mechanism in a solid state amplifier.

A still further object is to provide a novel and improved signal translation system which utilizes controllable transit time characteristics of semiconductor materials to tune the operation for a solid state semiconductor device.

A further object is to provide a solid state tunable signal translation device wherein a portion of the output is fed back in proper phase to the input to give it a frequency selected characteristic.

A still further object is to provide a novel and improved band pass signal translation system which does not require any inductances so that it can be completely molecularized in a monolithic semiconductor block.

Another object is to provide a new and improved semiconductor tuned amplifier suitable for partial or complete monolithic construction.

A still further object is to provide a new and improved semiconductor tuned amplifier or oscillator employing a delay cable.

These and other objects will become more clearly apparent after a study of the following specification when read in connection with the accompanying drawings, in which.

Figure 1:
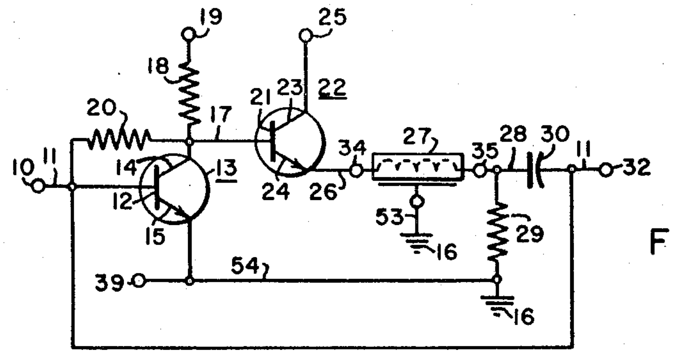
FIGURE 1 is a circuit diagram of a transistorized equivalent electrical circuit according to one embodiment of the invention.

Referring now to the drawings, in which like reference characters are used throughout to designate like parts, in the embodiment of the invention illustrated in FIG. 1, there is shown at 10 an input terminal for the signal to be amplified, which signal it is understood is applied with reference to ground or some other common circuit point. Terminal 10 may be an ohmic connection on a block of semiconductor material. Input terminal 10 is connected by lead 11, which may be a highly doped channel in a semiconductor block, to the base 12 of a transistor portion generally designated 13, having collector 14 and an emitter 15 connected to ground 16. The collector 14 is connected by way of lead portion 17 and resistor 18 to a suitable source, not shown, of energizing potential connected as at terminal 19. In accordance with molecular engineering concepts, resistor 18 may be a suitably doped region or channel in the block of intrinsic material. Leads 17 and 11 have resistor portion 20 connected therebetween for providing a potential to the base 12 so that the collector and emitter are properly biased with respect to the base. The aforementioned lead portion 17 is connected to the base 21 of an additional transistor portion 22 having collector 23 and emitter 24. Collector 23 is connected to terminal 25 to which is connected a suitable source of energizing potential, not shown, having the other terminal thereof connected to ground 16. The aforementioned emitter 24 is connected by lead 26 to terminal 34, which may be an ohmic connection on the semiconductor block, and to which is connected one end of a delay cable 27, the other end of the delay cable 27 being connected to terminal 35 which may be an ohmic or non-rectifying connection to the semiconductor block, the terminal 35 being connected inside the block by lead portion 28 and resistor portion 29 to ground 16, lead 28 being connected by way of capacitor portion 30 and lead portion 11 to output terminal 32. The capacitor 30 may be formed inside the semiconductor block by two doped layers separated by an intrinsic layer, or by a reversed-biased junction, any suitable biasing means, not shown, being employed. It will be seen that output lead 11 is directly connected to the aforementioned input lead 11, the two leads being integral with each other if desired. As will be readily understood, the transistor portion 23 is connected as an emitter follower or grounded collector transistor. All internal ground points 16 may be interconnected inside the semiconductor block by lead means 54 and to one ohmic contact 39. The grounding leg of the delay cable 27 is connected by lead means 53 to ground 16. Lead means 53 may be external or internal to the semiconductor block, as desired.

Figure 3:
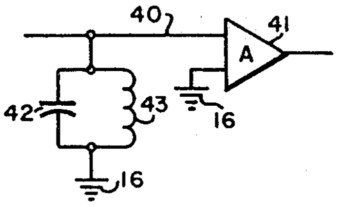
FIG. 3 is an electrical circuit diagram helpful in describing the operation of the circuits of FIGS. 1 and 2.

Particular reference is made now to FIG. 3. Assume by way of example that a signal on lead 40 is applied to the input of an amplifier 41 and that between lead 40 and ground 16 is connected a parallel-resonant circuit including the capacitor 42 and the inductor 43. As will be understood, the parallel-resonant circuit presents a very high impedance to alternating current signals having a frequency corresponding to the resonant frequency of 42–43, whereas the impedance from lead 40 through the circuit of capacitor 42 and inductor 43 to ground 16 drops off rapidly as the frequency of the signal on lead 40 deviates from the resonant frequency, the slope of the curve being a function of the quality factor Q of the L–C circuit, so that in effect the parallel resonant circuit bypasses signals to ground which deviate by a substantial amount from the frequency of resonance.

In the apparatus of FIG. 1, for all intents and purposes, a similar effect is employed, by providing a feedback path through the delay cable 27 whereby signals are delayed or shifted in phase 360 degrees (a 180 degree phase shift may occur in transistor portion 13 and an additional 180 degree phase shift may take place in the delay cable 27) and are applied back by way of lead 11 to the input terminal 10 in phase to provide positive feedback and in effect build up the input signal or, in other words, prevent the attenuation of the input signal.

As previously stated with respect to the input signal at terminal 10, a phase shift of 180 degrees occurs in the transistor portion 13. The transistor portion 22 connected as an emitter follower provides no phase shift, but a phase shift of an additional 180 degrees or more precisely a time delay corresponding to a shift of 180 degrees, is provided in the cable 27 for signals of a certain frequency so that an amplified signal is applied by way of lead 11 to input terminal 10 which is in phase with the input signal and accordingly selectively builds up a certain frequency component or components in the input signal as if the input signal were applied to a tuned circuit itself. It will be understood that the feedback signal is not allowed to obtain sufficient amplitude whereby the circuit becomes unstable and breaks into oscillation if a tuned amplifier is desired.

Figure 2:
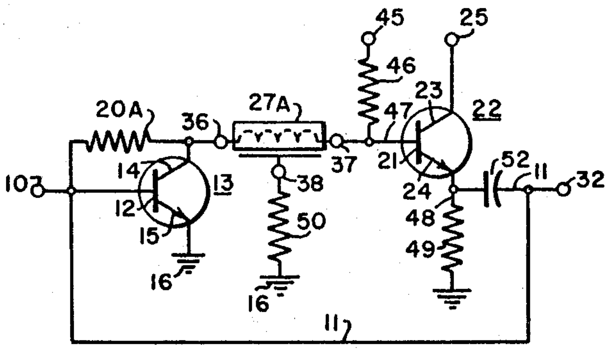
FIG. 2 is a circuit diagram of a transistorized equivalent electrical circuit according to a second embodiment of the invention.

Particular reference is made now to FIG. 2. In FIG. 2, the input transistor portion 13 has the collector 14 thereof connected to terminal portion 36 and the input of a delay cable 27A which corresponds to the cable 27 of FIG. 1 except that the cable 27A has the resistor 50 connected at terminal 38 in the grounding leg of the cable. Current for energizing transistor portion 13 is applied from terminal 45 through resistor portion 46, lead portion 47, through terminal portion 37 and the delay cable 27A and thence to collector 14. Collector 14 is connected by resistor portion 20A to base 12 to provide proper bias for transistor 13. The lead 47 is connected to the aforementioned base 21 of the emitter follower connected transistor portion 22 which, in this embodiment, has the emitter 24 connected by way of lead portion 48 and resistor portion 49 to ground 16. The output signal is developed across resistor 49 and is coupled by way of capacitor portion 52 to output lead 11 and output terminal 32, which may be an ohmic or non-rectifying contact on the semiconductor block. Lead 11 is common to the input and output.

The operation of the circuit of FIG. 2 is similar in several respects to the operation of the circuit of FIG. 1, a 180 degree phase shift taking place in transistor portion 13 and an additional 180 degree phase delay taking place in cable 27A for signals of a certain frequency. The output of the cable 27A is applied without substantial further phase shift by way of the emitter follower transistor portion 22 and lead 11 to the aforementioned input terminal 10. As previously stated, the resistor 50 in the grounding lead of the cable 27A may provide the effect of a notch filter. The notch filter markedly attenuates a certain frequency component while at the same time providing a phase shift of 180 degrees for this frequency component. Frequencies which differ substantially from the notch frequency are not substantially attenuated, and their phase shift may not be 180 degrees. The effect (FIG. 3) may more closely resemble a series resonant L–C circuit connected from lead 40 to ground 16.

If desired, resistor 50 may be eliminated and the grounding lead of the cable connected directly to ground 16.

The reference numerals 27 and 27A may represent a p-n junction type notch filter similar to that disclosed in copending application S.N. 5,045, filed Jan. 27, 1960, in the name of William M. Kaufman, which matured into Patent 3,212,032 and is assigned to the assignee of this application. It will be apparent that by the choice of the proper polarity for the semiconductor regions the p-n junction will be automatically back-biased by operating voltages on the transistors. Also, if desired, a back-biased p-n junction, constituting a distributed R–C network, without the lumped resistor of the Kaufman application may be used.

Figure 4:
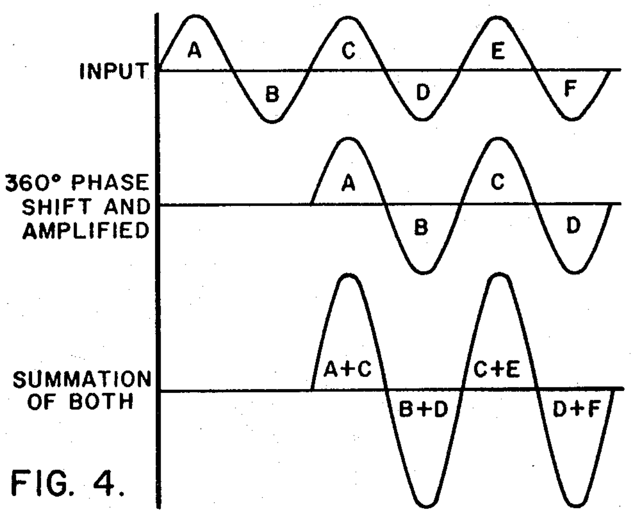
FIG. 4 is a graph further illustrating the operation of the apparatus of FIGS. 1 and 2.

In short, the active element structure may operate in two distinct modes, regenerative with low pass or delay structures or degenerative with the notch type structures. When regenerative, the amplified signal energy is fed back in phase with the input signal of the desired frequency so as to reinforce it and overcome circuit losses, as shown in FIG. 4.

In the degenerative mode, all signals are fed back except that frequency largely eliminated by the notch filter. Under these conditions if the phase shift around the loop is the proper magnitude, that is, 180 degrees or an odd multiple thereof, all signals cancel one another except the rejected frequency, the amplitude of which is insufficient to cause cancellation at the feedback summing point.

It will be understood by those skilled in the semiconductor art that the entire apparatus of FIG. 1 and FIG. 2 with the exception of the delay cable may be formed by suitable well known techniques from a single block of intrinsic semiconductor material, by the addition of impurities of the desired type and concentrations in the desired positions in the block. FIG. 1, for example, may require on the semiconductor block in addition to terminals or ohmic contacts 34 and 35 to which the delay cable is connected, input and output terminals 10 and 32, common circuit point terminal 39, and circuit energizing terminals 19 and 25. As is well known, resistive regions of any desired resistance are formed by controlled doping; lead connections are formed by doping with sufficiently high concentrations such, for example, as $1\times10^{25}$ impurities per cc. so that the material acts like a conductor; capacitance may be provided by the depletion region of a reverse-biased p-n junction or by two highly doped layers separated by an intrinsic layer. Transistor sections are conventional p-n-p or n-p-n regions.

The apparatus of FIG. 1 may be modified by inserting suitable resistance in lead means 53 to provide a notch filter effect in this circuit.

Figure 5:
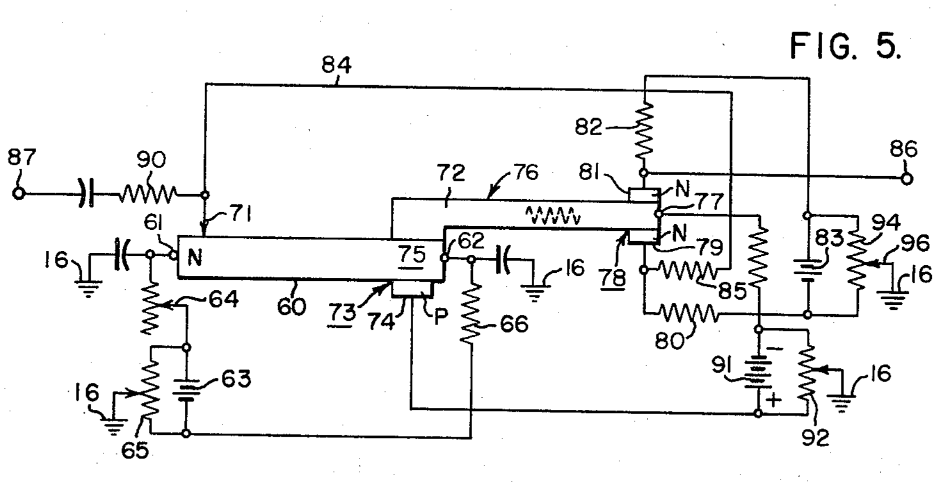
FIG. 5 is a diagrammatic illustration of a third embodiment of the invention wherein a semiconductor transport delay element is integral with transistor amplifier stages.

In the embodiments previously described, the transport delay element is illustrated as a section of delay cable which may be conventional coaxial cable waveguide or even a conventional conducting winding on a magnetic core. In the embodiments of the invention illustrated in FIGS. 5, 6 and 7, a filamentary body of elongated semiconductive material, to which a drift field is applied as briefly explained previously, is utilized as a signal transport delay element. In the embodiment of FIG. 5, a delay element and the base of a transistor amplifier are integral, one portion of the elongated filamentary body of semiconductive material serving as the transport delay element while another portion of a semiconductor body serves as a base of the transistor amplifier section. In the embodiments of the invention shown in FIG. 6, the semiconductor body is physically separated from the transistor amplifier section, a separate rectifying emitter junction being interposed between the semiconductor body and the base of the transistor amplifier. As in the embodiment in FIG. 5, the transistor amplifier section provides a certain amount of power gain and at the same time provides substantially 180° in electrical phase shift and relies upon an injector emitter electrode on the semiconductor body and the drifting carrier mechanism described briefly above to provide the regenerative feedback for selected frequencies at the input of the transistor amplifier.

Figure 6:
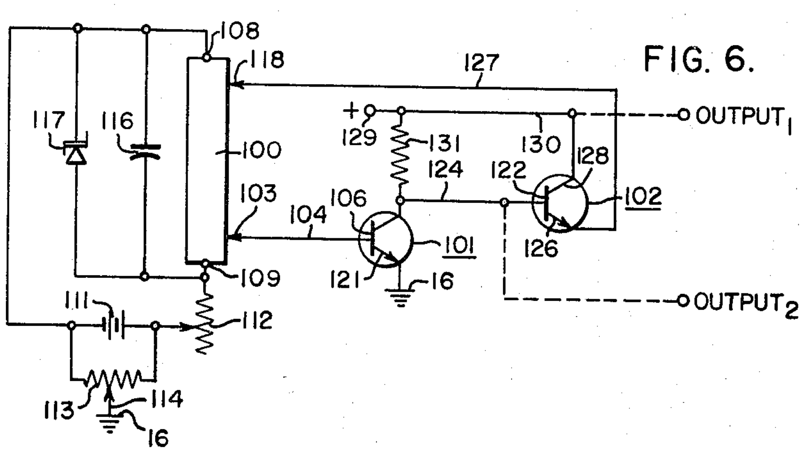
FIG. 6 is a diagrammatic illustration of a fourth embodiment wherein a semiconductor transport delay element is separate from the transistor amplifier stage.

Also, in both of the embodiments of FIGS. 5 and 6, an additional emitter follower impedance matching and isolation stage is provided between the transistor amplifier section and the injector emitter on the filamentary semiconductor body.

It is not absolutely essential that the impedance matching and isolation stage be interposed between the output of the transistor amplifier stage and the injector emitter on the semiconductor delay line. Such a modification is illustrated in the embodiment of FIG. 7 which also illustrates a circuit configuration for optimizing the class A mode of amplification by a special biasing arrangement.

Referring now to the latter three embodiments in greater detail, a filamentary semiconductor body 60 is provided with two ohmic contacts 61 and 62 at their respective opposite ends thereof across which there is applied a variable source of drift voltage from a battery 63 through a rheostat 64 and a dropping resistor 66. A potentiometer 65 across the battery 63 has its slider connected to ground 16. The semiconductor body 60 is illustrated as being N-type germanium but it is of course understood that P-type material could be used with the appropriate changes in the material used for the rectifying junction contacts in the manner well understood by those skilled in the art. An input signal may be coupled into the system when used as a frequency selective amplifier.

Figure 7:
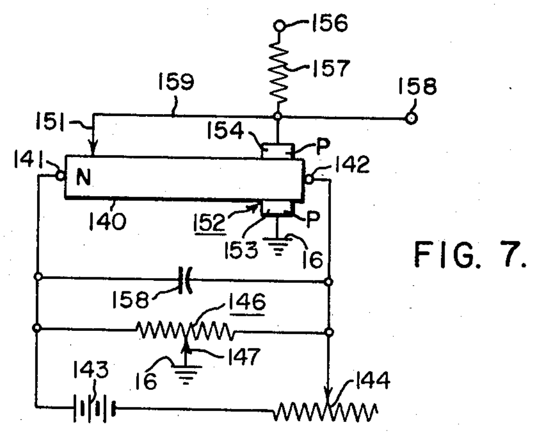
FIG. 7 is a diagrammatic illustration of a fifth embodiment of the invention also utilizing a temiconductor transport delay element.

As distinguished from the embodiments in FIGS. 6 and 7, in FIG. 5 an injector emitter electrode 71 has a rectifying contact with the left-hand end of the semiconductor body 60 adjacent the ohmic contact 61. In this embodiment, the collector electrode for the semiconductor body 60 is a rectifying contact in the form of a region of P-type semiconductive material indicated at 72 which also serves as a collector for a grounded emitter transistor amplifier section 73. The emitter 74 of this transistor section is grounded for A.C. signal potentials so that the signal on the collector 72 is 180 electrical degrees out of phase with the signal carried by the carriers reaching the transistor section from the ejector emitter 71.

Merely for the purpose of diagrammatic illustration, the collector 72 may be an integral part of a larger body of semiconductor material 76 of the same conductivity type and, if desired, this portion of the body may be so doped as to constitute a resistance. Fabrication techniques for making semiconductor devices are now well known so that such an integral construction could be made if desired. The right-hand end of the semiconductor body 72 constitutes the base 77 of a second transistor stage 78 connected in an emitter follower configuration, having the usual emitter 79 and collector 81. Through a suitable resistor 82 the collector 81 is connected to the positive side of a suitable source of positive potential, such as the battery 83. The other terminal of battery 83 is connected through a load resistor 80 to the emitter 79. The latter is also connected through a feedback resistor 85 and lead 84 to the injector emitter 71 of the semiconductor delay unit. The output of the system may be taken at the terminal 86 which is connected directly to the collector 81 of the second amplifier stage. Input signals are supplied through the input terminal 87 which may be coupled capacitively through an isolating resistor 90 to the ejector emitter 71.

It will be observed in the circuit configuration of FIG. 5 that the first transistor stage 73 is a grounded emitter to provide phase inversion for all input signals while the second stage 78 operates as an emitter follower so that the second stage 78 constitutes an impedance matching unit as well as an isolating unit so that there is efficient coupling between the output of the first transistor stage 73 and the injector emitter 71 on the drift field semiconductor delay unit 60.

Accordingly a battery 91 is connected between the emitter 74 of the transistor 73 and the base 77 of the transistor 78, a potentiometer 92 being connected across the battery 91 and having a grounded slider arm 93. Consistently with that, another potentiometer 94 is connected across the terminals of battery 83 and the slider arm 96 is grounded. It will be apparent to those skilled in the art that the sliders on these potentiometers would be adjusted to provide the mode of operation mentioned.

The frequency of the output of the system is a function of the transit time of the minority carriers through the semiconductor delay unit 60 and accordingly the frequency may be adjusted by varying the drift voltage applied to the ohmic contacts 61 and 62 by adjusting the rheostat 64. The gain of the device may be adjusted in a conventional manner such as by adjusting the position of the potentiometer slider arms. If the gain is adjusted to a point above threshold, the system will act as an oscillator in which the input terminal 87 would not be used.

FIG. 5 is intended merely as a diagrammatic illustration of a molecularized version of an integrated solid state circuit in a monolithic semiconductor block which includes the semiconductor delay line 60, the first amplifier transistor stage 73 and the second transistor amplifier stage 78 which serves as the impedance matching and isolation stage. No attempt is made to show the exact topology for such a molecularized unit since the fabrication techniques for such monolithic units is well known in the art.

To all intents and purposes, the embodiment of the invention shown in FIG. 6 is similar to that shown in FIG. 5 except that the semiconductor drift line delay unit 100 in FIG. 6 is not an integral part of the base of the first transistor amplifier stage 101. Also, the second impedance matching and isolator stage 102, may, or may not, be an integrated part of the molecular block which might include the two amplifier stages 101 and 102. The significant difference between the two is that whereas in FIG. 5 the minority carriers proceeding from the injector emitter 71 in FIG. 5 passed directly through the semiconductor drift line unit 60 into the base 77 of the transistor unit 73 and then directly into the collector 72, in the embodiment of FIG. 6, the minority carriers passing into a separate collector 103 where transitions from minority to majority carriers takes place and an electric current of majority carriers passes as electrons through the collector lead 104 to the base 106 of the first amplifier stage 101.

More specifically, the filamentary drift line semiconductor body 100 is provided with ohmic contacts 108 and 109 across which a drift voltage is applied from the the battery 111 through the rheostat 112. A potentiometer 113 connected across the battery 111 has a grounded slider arm 114. A suitable bypass capacitor 116 is connected across the ohmic contacts on the delay line 100 and in parallel with the condenser 116 is an optional stabilizing diode 117 depending upon whether the system is used as an amplifier or oscillator.

As in the embodiment in FIG. 5, a suitable injector emitter 118 has a rectifying contact with the upper end of the semiconductor delay line 100 and the minority carriers injected into the delay line 100 through the injector emitter 118 will be superimposed upon the drift line flow through the semiconductor delay line 100 which is established by the drift line bias voltage applied by the battery 111. Any signal injected into the emitter 118 will be propagated through the delay line 100 which also acts as an ohmic resistor at a velocity which is determined by the magnitude of the drift line bias voltage between the ejector emitter 118 and the collector 103 where the signal will be represented by electrons which pass with substantially the velocity of light through the conductor 104 to the base 106 of the first amplifier stage 101. In the embodiment in FIG. 6, the amplifier stage 101 has its emitter 121 connected to ground and its collector 122 connected to the base 123 of the second transistor stage 102, through a lead 124. Similar to the arrangement in FIG. 5, the emitter 126 is connected through the lead conductor 127 to the ejection emitter 118 to provide feedback signals to the delay line 100. The collector 128 is connected directly to a source of potential represented by the terminal 129 through lead 130 while the collector 122 of the first transistor stage is connected to the terminal 129 through a load resistor 131.

Here again, it is to be noted that the second transistor stage 102 is connected as an impedance matching and isolation stage through which the output signals appearing on the collector 122 of the first transistor stage 101 are supplied to the injector emitter 118 of the semiconductor delay line 100. As in the previous embodiment, the bias voltage across the drift 100 line may be adjusted so that the transit time between the injector emitter 118 and the collector 103 on the semiconductor line 100 provides the appropriate phase shift to the signals for a desired frequency to produce regenerative action. The output from the system can be taken from various points in the circuit such as at the collector 128 of the second stage or from the lead 124 between the collector 122 of the first stage and the base 122 of the second stage.

It is to be noted that in both FIGS. 5 and 6 the circuit configurations for the respective transistor stages is the same although it appears simpler in FIG. 6.

In the modified form of the invention illustrated in FIG. 7, the second impedance matching and isolation stage is not utilized. The biasing arrangement similar to that in FIGS. 5 and 6 provides a virtual ground within the delay line structure to obtain optimum performance in the class A mode of amplification when the impedance matching and isolation stage is not utilized.

More specifically in FIG. 7, a semiconductor body 140 constitutes a combination drift line and base of a transistor amplifying stage as in the embodiment of FIG. 5. The body 140 is provided with ohmic contacts 141 and 142 to which a biasing drift voltage is applied from the battery 143 through a rheostat 144. A potentiometer 146 is connected directly across the ohmic contacts 141 and 142 and a slider arm 147 of the potentiometer may be adjusted so that the virtual AC ground may be adjusted anywhere between the ohmic contacts 141 and 142 on the semiconductor body 140. A capacitor 148 is also connected across the ohmic contacts on the semiconductor body 140 so that a balance between regenerative and degenerative feedback can be provided to at least partially compensate for the lack of the impedance matching and isolation stage of the previous two modifications.

In this embodiment, an injector emitter 151 has a rectifying contact with the left-hand end of the semiconductor body through which minority carriers are injected into the latter. These injected carriers drift through the semiconductor body 140 under the influence of the biasing voltage and they enter into the transistor action which takes place in the transistor amplifier stage 152 between the grounded emitter 153 and the transistor collector 154. The collector 154 is connected to a suitable source of voltage represented by the terminal 156 through the load resistor 157. The output from the system may be supplied at terminal 158 which is connected to the collector 154. By means of lead 159, the output signal from the collector 154 is fed back to the injector emitter 151 of the delay line. Assuming uniform resistance in the potentiometer 146, the position of the virtual AC ground for any signal in the system is at a point in the semiconductor delay line 140 which is determined by the proportionality relation of the position of the arm of the potentiometer to the total distance between the ends of the potentiometer. The purpose of the condenser 138 is to provide a substantial and uniform bypass for AC signals regardless of the position of the slider arm 147.

Although it is clear that the conductivity type of the semiconductor regions can be switched in the manner well understood in the art, let it be assumed for purposes of illustration that the semiconductor body 140 is of N-type germanium. Then the injector emitter 151 on the delay line 140, as well as the transistor emitter 153 and the transistor collector 154, will be of P-type conductivity. As has been previously mentioned, the drift velocity of the minority carriers, under the influence of the electric field in the semiconductor delay line can be varied over a very wide range. As long as the minority carrier lifetime is at least as long as the period of the lowest frequency to be propagated through the system, a corresponding wide range of tuning can be accomplished by varying the bias voltage on the semiconductor delay line. Also, drift doping may be used to supply or supplement applied electric fields needed to produce a given drift velocity for a selected frequency range.

When the minority carriers in this instance are injected through the injector emitter 151 into the semiconductor body 140 under the influence of the electric bias field they will drift to the base portion of the transistor 152 at the right-hand end of the semiconductor body 140 and, accordingly, the signal will be amplified by the usual transistor action. Because the transistor amplifier stage 152 is a grounded emitter, signals of all frequencies applied to the base of the transistor stage will be inverted and this signal voltage will be applied through the lead 159 to the injector emitter 151 of the delay line. Now, if the drift bias voltage supplied by the battery 143 through the ohmic contacts 131 and 132 of the semiconductor body 140 is such that the transit time between the injector emitter 151 and the base portion of the amplifier stage 152 is equal to substantially one-half of the period of the AC signal, regenerative action will take place so that the so-called "on-frequency" signals will be reinforced while the so-called "off-frequencies" will be canceled.

The biasing arrangement described above is such that there is a balance between the regenerative and the degenerative action at the desired frequency so that stable operation exists. For purposes of analysis, the semiconductor body 140 can be considered to be a feedback resistor connected between the collector 154 of the transistor and the base portion of the transistor. This would normally produce a degenerative feedback which would prevent the transistor stage from amplifying but by reason of the capacitor 158 enough of the feedback signal is shorted to ground so that stable regenerative action takes place while at D.C. degenerative stabilization will occur for thermal stability.

The impedance matching and isolation means of the different embodiments also serve as unilateralization means.

It will readily be apparent to those skilled in the art that many changes and variations may be made in the circuit configurations illustrated without departing from the spirit and scope of the present invention.

We claim as our invention:

1. A tuned amplifier comprising input means and output means, circuit means including a first and second transistor means and signal delay means between said input and said output means, said first transistor means being connected in a grounded emitter configuration and having its input connected to said input means, said second transistor means being connected in an emitter follower configuration and having its base-emitter junction included in series with said delay means and the collector output of said first transistor means in said circuit means between said input and said output means, said first transistor means providing a phase shift of all input signals by an amount due to the electrical phase relations between the input on the base and the output on the collector, said signal delay means providing a signal delay corresponding to a phase shift of substantially 180° for a selected band of frequencies and means for feeding back from said output to said input a signal representing regenerative feedback for said selected band of frequencies.

2. A tuned amplifier comprising input means and output means, circuit means including first and second transistor means and signal delay means connected between said input and said output means, said first transistor means being connected in a grounded emitter configuration and having its input connected to said input means, said second transistor means being connected in an emitter follower configuration, the collector of said first transistor means being connected to the base of said second transistor means and said signal delay means being connected between the emitter of said second transistor means and said output means, said first transistor means providing a phase shift of all of the input signals by an amount due to the electrical phase relations between the input on the base and the output on the collector, said delay means providing a signal delay corresponding to a phase shift of substantially 180 electrical degrees for a selected band of frequencies and circuit means connecting said output to said input for providing a regenerative feedback signal to the input for said selected band of frequencies.

3. A tuned amplifier comprising input means and output means, circuit means including first and second transistor means and signal delay means connected between said input means and said output means, said first transistor means being connected in a grounded emitter configuration and having its input connected to said input means, said second transistor means being connected in an emitter follower configuration, said signal delay means being connected between the collector of said first transistor means and the base of said second transistor means, the emitter of said second transistor means being connected to said output means, said first transistor means providing a phase shift of all of the input signals by an amount due to the electrical phase relations between the input on the base and the output on the collector, said signal delay means providing a signal delay corresponding to a phase shift of substantially 180 electrical degrees for a selected band of frequencies and circuit means connected between said output means and said input means for providing a regenerative feedback signal to the input means for said selected band of frequencies.

4. A tunable signal translation system comprising input means and output means, circuit means including first and second transistor means and signal delay cable means connected between said input means and said output means, said first transistor means being connected in a grounded emitter configuration and having its input connected to said input means, said second transistor means being connected in an emitter follower configuration, said signal delay cable means being connected between the collector of said first transistor means and the base of said second transistor means, the emitter of said second transistor means being connected to said output means, said first transistor means providing a phase shift of all the input signals by an amount due to the electrical phase relations between the input on the base and the output on the collector of the grounded emitter transistor, said delay cable means providing a signal delay corresponding to a phase shift of substantially 180 electrical degrees for a selected band of frequencies and circuit means connected between said output means and said input means for providing a regenerative feedback signal to the input means for said selected band of frequencies.

5. A tuned amplifier comprising input means and output means, circuit means including first and second transistor means and signal delay cable means connected between said input and said output means, said first transistor means being connected in a grounded emitter configuration and having its input connected to said input means, said second transistor means being connected as an emitter follower, the collector of said first transistor means being connected to the base of said second transistor means and said signal delay cable means being connected between the emitter of said second transistor means and said output means, said first transistor means providing a phase shift of all of the input signals by an amount due to the electrical phase relations between the input on the base and the output on the collector of a grounded emitter transistor, said delay cable means providing a signal delay corresponding to a phase shift of substantially 180 electrical degrees for a selected band of frequencies and circuit means connecting said output to said input for providing a regenerative feedback signal to the input for said selected band of frequencies.

References Cited

UNITED STATES PATENTS

| | | | |
|---|---|---|---|
| 2,816,228 | 12/1957 | Johnson. | |
| 2,912,583 | 11/1959 | Geyer | 333—29 XR |
| 3,107,331 | 10/1963 | Barditch et al. | |
| 3,206,620 | 9/1965 | Freeman et al. | 307—88.5 |

OTHER REFERENCES

Applications Engineering Digests, April 1961, p. 51, Semiconductor Products.

McCue: Semiconductor Delay Lines, Tech. Report No. 179, Lincoln Laboratory, MIT, April 15, 1958 (Rec'd in Scientific Library Oct. 7, 1960), 9 pages incl. cover and title page, p. 1 relied on. (Copy in Scientific Library, TK 7855–M26.)

ROY LAKE, *Primary Examiner.*

N. KAUFMAN, *Examiner.*

F. D. PARIS, *Assistant Examiner.*